US012810951B2

(12) United States Patent

Chou et al.

(10) Patent No.: US 12,810,951 B2

(45) Date of Patent: Nov. 24, 2026

(54) MEMORY DEVICE AND PROGRAMMING METHOD BY PERFORMING SENSING OPERATION ON PREVIOUS STATE

(71) Applicant: MACRONIX International Co., Ltd., Hsinchu (TW)

(72) Inventors: You-Liang Chou, Taichung City (TW); Wen-Che Tsai, Hualien City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 140 days.

(21) Appl. No.: 18/931,047

(22) Filed: Oct. 30, 2024

(65) Prior Publication Data

US 2026/0120782 A1 Apr. 30, 2026

(51) Int. Cl.

*G11C 16/34* (2006.01)
*G11C 16/10* (2006.01)
*G11C 16/26* (2006.01)

(52) U.S. Cl.

CPC ........ *G11C 16/3459* (2013.01); *G11C 16/102* (2013.01); *G11C 16/26* (2013.01)

(58) Field of Classification Search

CPC .... G11C 16/3459; G11C 16/102; G11C 16/26
See application file for complete search history.

(56) References Cited

U.S. PATENT DOCUMENTS 11,861,239 B2 1/2024 Tanaka
2008/0144370 A1 * 6/2008 Park .................... G11C 11/5628 365/185.03
2017/0372784 A1 12/2017 Tang et al.
2020/0350022 A1 11/2020 Choo
2022/0180941 A1 6/2022 Choi
(Continued)

FOREIGN PATENT DOCUMENTS

TW I640008 11/2018
TW I733131 7/2021

OTHER PUBLICATIONS

"Office Action of Taiwan Counterpart Application", issued on Aug. 7, 2025, p. 1-p. 8.
(Continued)

*Primary Examiner* — Sultana Begum

(74) *Attorney, Agent, or Firm* — J.C. PATENTS

(57) ABSTRACT

An operating method for a memory device and a memory device therefore are provided. The memory device is a 3D NAND flash with high capacity and high performance. The operation method comprises: performing a programming operation to the plurality of the memory cells based on an i-th potential state. The programming operation to the plurality of the memory cells based on an i-th potential state comprises: in a program pulse phase, applying a program pulse corresponding to the i-th potential state to a plurality of first memory cells corresponding to the i-th potential state; and, in a verification phase after the program pulse phase, performing a first sensing operation to a plurality of second memory cells in the (i−1)-th potential state to verify a situation of threshold voltage distributions of the plurality of the second memory cells, and performing a second sensing operation to the plurality of the first memory cells to implement a program verification operation of the i-th potential state.

16 Claims, 6 Drawing Sheets

(56) References Cited

U.S. PATENT DOCUMENTS

| | | | |
|---|---|---|---|
| 2024/0177784 | A1 | 5/2024 | Choi et al. |
| 2024/0331785 | A1 | 10/2024 | Kang et al. |

OTHER PUBLICATIONS

Ted Pekny et al., "A 1-Tb Density 4b/Cell 3D-NAND Flash on 176-Tier Technology with 4-Independent Planes for Read using CMOS-Under-the-Array", 2022 IEEE International Solid-State Circuits Conference (ISSCC), Mar. 2022, pp. 1-3.

Wanik Cho et al., "A 1-Tb, 4b/Cell, 176-Stacked-WL 3D-NAND Flash Memory with Improved Read Latency and a 14.8Gb/mm2 Density", 2022 IEEE International Solid-State Circuits Conference (ISSCC), Mar. 2022, pp. 1-2.

* cited by examiner

| | logic value | program verification operation of potential state S1 is passed | program verification operation of potential state S2 has not been passed yet | |
|---|---|---|---|---|
| target memory cells | | cells in potential state S1 | cells in potential state S2 | cells in potential state S3-S7 |
| first sensing operation | "1" | SD_1 | | |
| | "0" | SU_1 | | |
| second sensing operation | "1" | | memory cells that fail program verification operation of S2, voltage of the program pulse needs to be increased in steps to continue program verification operation of S2 | continue program verification operation |
| | "0" | | memory cells that passes program verification operation of S2 | continue program verification operation |

FIG. 5

MEMORY DEVICE AND PROGRAMMING METHOD BY PERFORMING SENSING OPERATION ON PREVIOUS STATE

BACKGROUND

Technical Field

The disclosure relates to a data processing technology applied to a memory device (e.g., 3D NAND flash memory), and in particular relates to an operation method for a memory device and a memory device therefore.

Description of Related Art

Integrated circuit memory with high capacity and high performance, which includes 3D NAND flash memory, is continuously developing. It aims to increase data storage density by reducing the size of memory cells using 3D stacking technology and triple-level cells (TLC).

Memory cells of more-level cell type (for example, a multi-level cell (MLC) type, a triple-level cell (TLC) type, and a quad-level cell (QLC) type) can store multi-bit data through multiple threshold voltage distributions. For example, a triple-level cell may have an erase state S0 and potential states S1 to S7 after programing operations. In certain applications, it may want to know threshold voltage distributions in memory cells after programming operations, so as to facilitate subsequent memory operations (such as, a validation of increment-step-pulse-programming (ISPP) operations, a programming operation for other memory blocks, an adjustment or a manipulation of tail region/lower boundary of the threshold voltage distributions, etc.). However, it requires additional time overhead for determining the numbers of memory cells in the upper part or the lower part of potential states S1 to S7. Therefore, how to reduce the time overhead for data access in the memory device is one of research directions.

SUMMARY

An operation method for a memory device and the memory device therefore are provided, threshold voltage distributions can be determined by performing a sensing operation on memory cells in the previous potential state during the verification phase of a programming operation, thereby reducing the time overhead associated with reading operations on memory cells.

An operation method for the memory device of the embodiment of the disclosure is provided. The memory device comprises a memory block with a plurality of memory cells, each of the plurality of the memory cells comprising N potential states associated with a plurality of threshold voltage distributions, N is a positive integer. The operation method comprising: performing a programming operation to the plurality of the memory cells based on an i-th potential state among the N potential states, i is a positive integer greater than 1 and i is less than or equal to N. The programming operation based on the i-th potential state comprises: in a program pulse phase, applying a program pulse corresponding to the i-th potential state to a plurality of first memory cells corresponding to the i-th potential state; and, in a verification phase after the program pulse phase, performing a first sensing operation to a plurality of second memory cells in the (i−1)-th potential state to verify a situation of threshold voltage distributions of the plurality of the second memory cells, and performing a second sensing operation to the plurality of the first memory cells to implement a program verification operation of the i-th potential state.

A memory device according to an embodiment of the disclosure includes a memory array and a memory controller. The memory array comprises a memory block. The memory block comprises a plurality of memory cells. Each of the plurality of the memory cells comprising N potential states associated with a plurality of threshold voltage distributions, N is a positive integer. The memory controller is coupled to the memory block. The memory controller is configured to: performing a programming operation to the plurality of memory cells based on an i-th potential state among the N potential states, i is a positive integer greater than 1 and i is less than or equal to N. The programming operation based on the i-th potential state comprises: in a program pulse phase, applying a program pulse corresponding to the i-th potential state to a plurality of first memory cells corresponding to the i-th potential state; and, in a verification phase after the program pulse phase, performing a first sensing operation to a plurality of second memory cells in the (i−1)-th potential state to verify a situation of threshold voltage distributions of the plurality of second memory cells, and performing a second sensing operation to the plurality of the first memory cells to implement a program verification operation of the i-th potential state.

Based on the above, the operation method for a memory device and the memory device therefore described in the embodiment of the disclosure involves inserting a sensing operation for memory cells in the previous potential state during a programming operation based on each potential state, in order to verify the threshold voltage distributions in the previous potential state. Moreover, the programming operations for each potential state will not significantly extend the operation time due to the inserted sensing operation. The aforementioned threshold voltage distributions may refer to an upper part and a lower part of the threshold voltage distribution for memory cells in the previous potential state. Therefore, this embodiment of the invention incorporates the step of verifying the threshold voltage distribution into the programming operation, thereby reducing the time overhead for reading operations on memory cells.

BRIEF DESCRIPTION OF THE DRAWINGS

FIG. 5 is a schematic diagram of the states of each memory cell in a programming verification operation for potential state S2 in an embodiment of the present invention.

DETAILED DESCRIPTION OF DISCLOSED EMBODIMENTS

Figure 1:
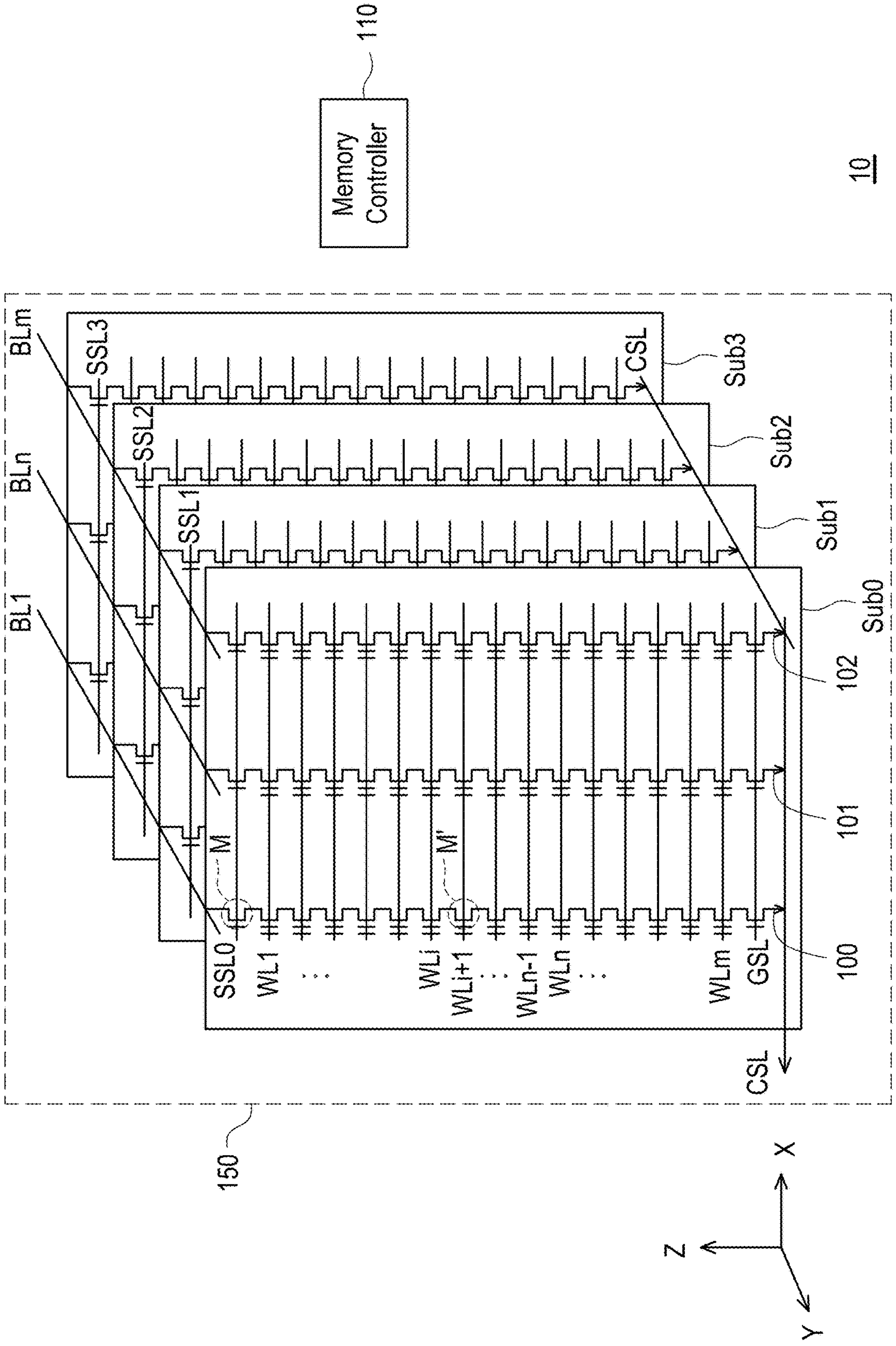
FIG. 1 illustrates an equivalent circuit diagram of a memory block in a 3D NAND memory device according to an embodiment of the present invention.

FIG. 1 illustrates an equivalent circuit diagram of a memory block 150 in a 3D NAND memory device 10 according to an embodiment of the present invention. The memory block 150 is a part of a memory array of the memory device 10. Memory cells (e.g., the memory cell M') are arranged in three dimensions, e.g., in an XYZ coordinate system, in the block 150. It does not imply the circuit of the 3D NAND memory device is limited in the 3D manner. In one example, the memory block 150 can be separated into four sub-blocks (e.g. the sub-blocks Sub0-Sub3) and each sub-block can be controlled operations independently.

A string (e.g., the string 100, 101 or 102) includes a plurality of memory cells (e.g., the memory cell M') connected in series along the Z direction. One memory cell (e.g., the memory cell M') in the string (e.g., 100) corresponds to a word line (e.g. the word line WLi+1). The word line (e.g., the word line WLn) can be a layer in the XY plane. A memory cell M can be configured as a string select transistor coupled to a string select line SSL (e.g. SSL0), and another one memory cell can be configured as a ground select transistor coupled to a ground select line GSL.

The string select transistor and the ground select transistor are disposed at opposite sides in the string (e.g., the string 100). In this example, the multiple strings (e.g., 100, 101, etc.) on a same plane (e.g. the plane defined by X direction and Z direction) coupled to a same string select line SSL (e.g. the string select line SSL0) may be defined as a sub-block (e.g. the sub-block Sub0).

Each of the strings (e.g., the string 100, 101 or 102) is connected to a corresponding bit line (e.g. the bit line BL1, the bit line BLn or the bit line BLm) via the corresponding string select transistors on the string select line SSL (e.g. the string select line SSL0). The string (e.g., the string 100) in a same column along the Y direction of different sub-blocks (e.g. the sub-block Sub0, the sub-block Sub1 . . . , etc.) are connected to a corresponding bit line (e.g. the bit line BL1). The string select line SSL can be a conductive line or a conductive layer formed over the top of the topmost word line layer (e.g., the word line WL1). Each of the strings (e.g., the string 100, 101 or 102) may be connected to a same common source line CSL via the corresponding ground select transistors on the ground select line GSL. The ground select line GSL can be a conductive line or a conductive layer formed under the bottom of the bottommost word line layer (e.g. WLm). The common source line CSL can be a conductive layer formed over a substrate of the 3D memory device. The string select line SSL (e.g. SSL0 to SSL3) in the block 150 can be on a same conductive layer but divided into separated lines. Each separated line (the string select line SSL) can independently control operations of a corresponding sub-block (e.g. the sub-blocks Sub0, Sub 1 . . . , etc.) of the block 150.

In one example, the memory cells (including the memory cell M') coupled to a same word line or a same word line layer (e.g., the word line WLn) in the sub-block (e.g. the sub-block Sub0) may be defined as a page (in SLC mode). In another example, the memory cells M' coupled to a same word line or word line layer (e.g., WLn) in the sub-block (e.g. the sub-block Sub0) may be defined as three pages (in TLC mode). In TLC mode, the three pages include a high page, a middle page and a low page. The memory cell M' on the same word line (e.g., the word line WLn) is applied by a same voltage. Each word line (e.g., the word line WLn) can be connected to a driving circuit, e.g., a X-decoder (or a scanning driver). In one example, one or more dummy lines or layers (not shown) are disposed between the string select line SSL (e.g. the string select lines SSL0 to SSL3) and the topmost word line layer (e.g., the word line WL1) of the strings 100, and/or between the ground select line GSL and the bottommost word line layer (e.g., WLm). In another example, one or more dummy lines or layers (not shown) are disposed in a middle portion of the strings (e.g., the strings 100, 101, 102). The memory device 10 also includes a memory controller 110 to implement corresponding operations on the memory cells.

Figure 2:
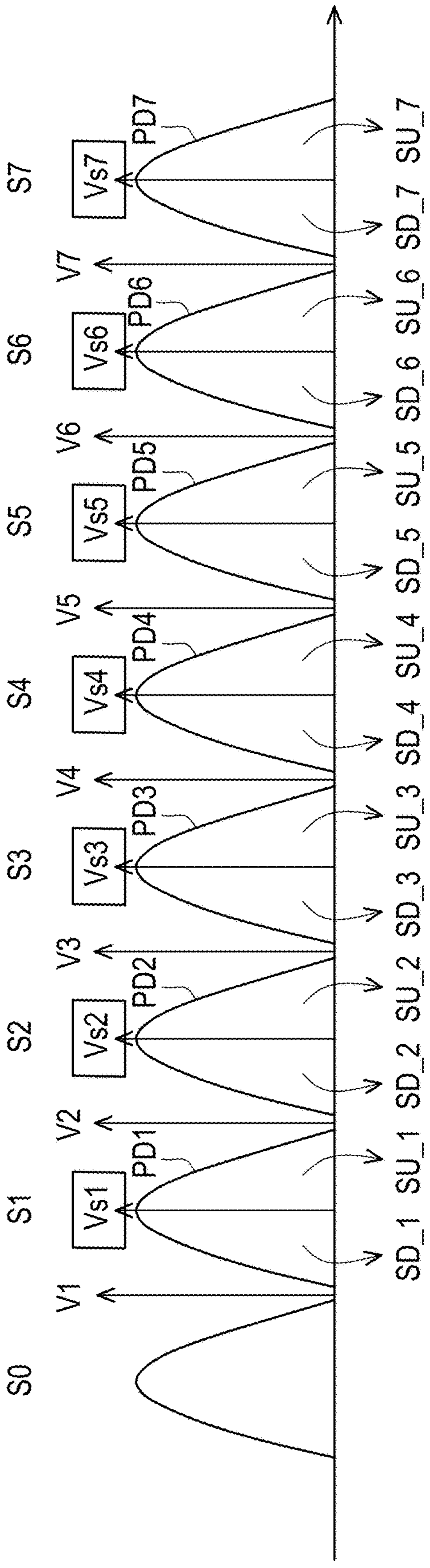
FIG. 2 is a schematic diagram illustrating threshold voltage distributions (e.g., the erase state S0 and the potential states S1 to S7) using memory cells of a triple-level cell (TLC) type according to an embodiment of the present invention.

FIG. 2 is a schematic diagram illustrating threshold voltage distributions (e.g., the erase state S0 and the potential states S1 to S7) using memory cells of a triple-level cell (TLC) type according to an embodiment of the present invention. FIG. 2 shows the threshold voltage distributions of a memory cell after programming operation. These threshold voltage distributions can be divided into erase state S0 and potential states S1~S7. The erasure state S0 and the potential states S1~S7 can be distinguished by the reference voltages V1-V7. The potential states S1-S7 are correspond to threshold voltage distributions PD1-PD7 respectively.

In certain applications, it may need to know the threshold voltage distributions PD1-PD7 are appropriate. For example, it may necessary to know the number of the upper part (e.g., the number of the upper part SU_1-SU_7 shown in FIG. 2) and the number of the lower part (e.g., the number of the lower part SD_1-SD_7 shown in FIG. 2) in the threshold voltage distributions PD1-PD7, as the basis for whether to "adjust or fix tail part of the threshold voltage distributions PD1-PD7". "Adjust or fix the tail part of the threshold voltage distributions PD1-PD7" is that when performing a programming operation on the next page (such as an ISPP operation), additional program pulses can be added to the ISPP operation to operate the threshold voltage distributions of the lower boundary of the lower part of PD1-PD7 (that is, the tail part of the threshold voltage distributions PD1-PD7 is expected to be fixed).

Therefore, if it wants to know the number of the upper part SU_1-SU_7 and the number of the lower part SD_1-SD_7 of the threshold voltage distributions PD1-PD7, it need to perform additional seven times of the read operations based on the reference voltages VS1-VS7 respectively, which takes extra execution time.

The embodiment of the present invention is to insert the sensing operation of the memory cell of the previous potential state (e.g., the potential state S1) into the programming operation based on a certain potential state (e.g., the potential state S2) to verify a situation of threshold voltage distributions of the previous potential state (e.g., knowing the number of the upper part and the number of the lower part of the threshold voltage distribution in the previous potential state). Moreover, the programming operation of each potential state will not cause the operation time to be extended due to the inserted sensing operation. Therefore, the embodiment of the present invention arranges the step of verifying the threshold voltage distribution in the programming operation to reduce the time overhead of data access in the memory device.

Figure 3:
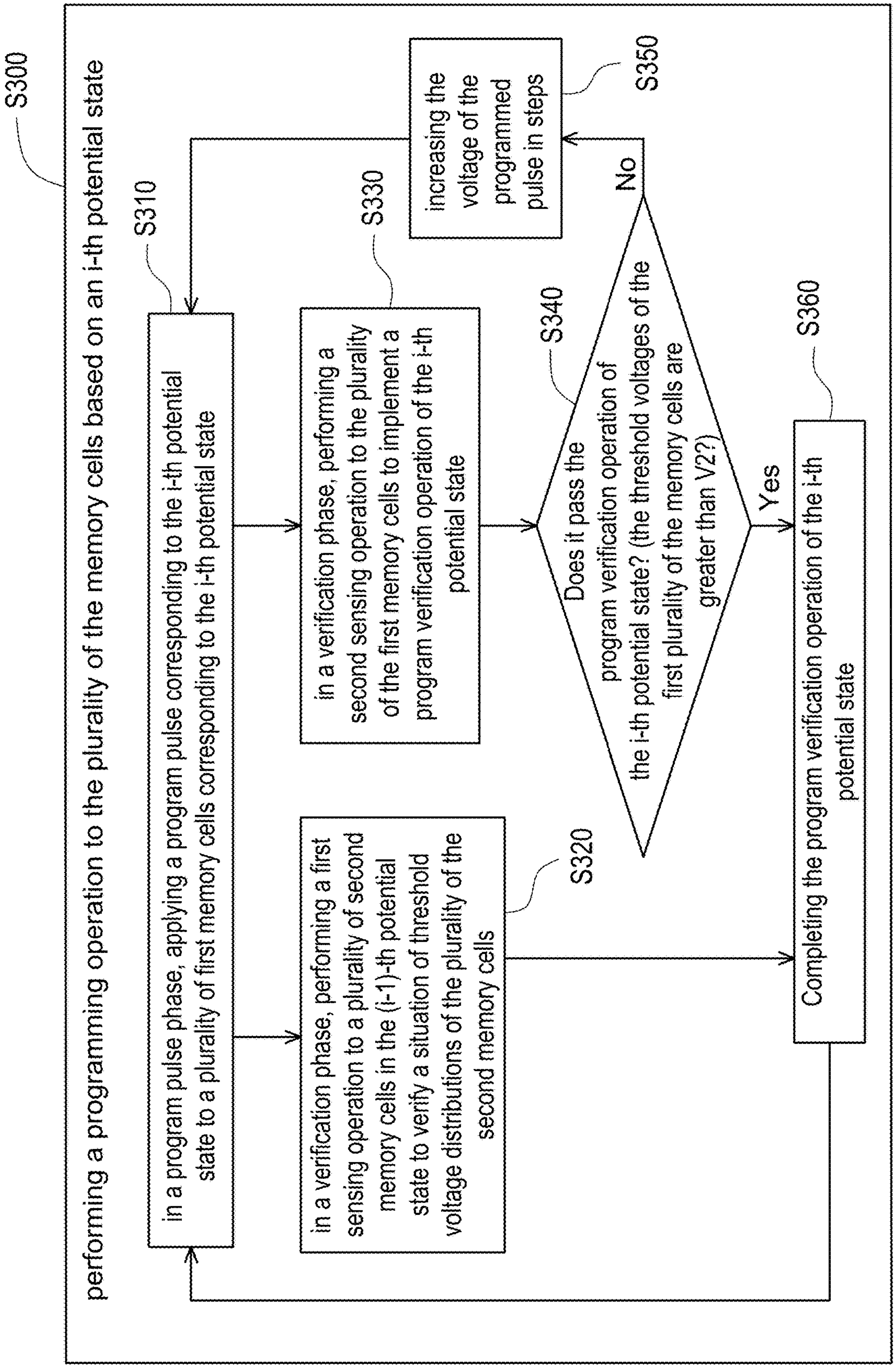
FIG. 3 is a flowchart of an operating method of a memory device according to an embodiment of the present invention.
Figure 4:
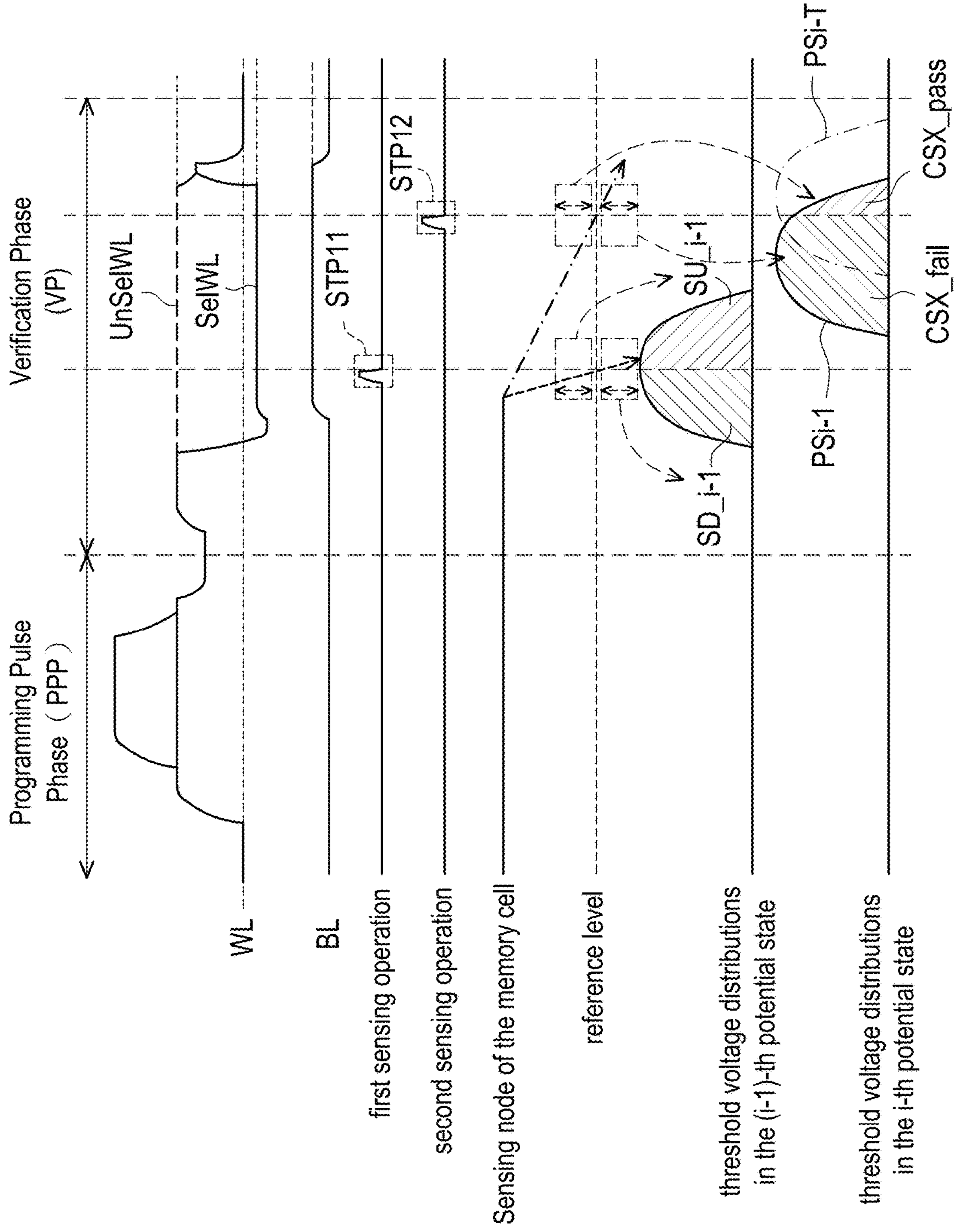
FIG. 4 is a schematic diagram of each signal in step S300 according to a first embodiment of the present invention.

FIG. 3 is a flowchart of an operating method of a memory device according to an embodiment of the present invention. The operation method in FIG. 3 can be implemented by the memory device 10 of FIG. 1. Moreover, the control method in FIG. 3 can be applied to memory devices with different memory cell types. The types of memory cells in the memory cell block 150 in FIG. 1 may be more-level cell type. The aforementioned more-level cell type may be one of a multi-level cell (MLC) type, a triple-level cell (TLC) type and a quad-level memory cell (QLC) type. FIG. 4 is a schematic diagram of each signal in step S300 according to the first embodiment of the present invention.

Please refer to FIG. 1, FIG. 3 and FIG. 4 at the same time. The operation method in FIG. 3 mainly includes a step S300. The memory controller 110 in FIG. 1 performs programming operations on a plurality of memory cells based on the i-th potential state among N potential states. 'i' is a positive integer greater than 1 and 'i' is less than or equal to N. Taking the triple-level cell (TLC) as an example, N is 7. For example, memory cells of the TLC type include potential states S1-S7 in FIG. 2. The 'i' is one of 2 to 7. For the convenience of description, 'i' may be assumed to be 2.

The step S300 includes steps S310 to S360. In step S310, in the program pulse phase PPP, the memory controller 110 of FIG. 1 applies a program pulse corresponding to the i-th potential state (e.g., the potential state S2) to a plurality of first memory cells corresponding to the i-th potential state (e.g., the potential state S2).

In step S320, in the verification phase VP after the program pulse phase PPP, the memory controller 110 of FIG. 1 performs a first sensing operation on a plurality of second memory cells in the first time period STP11 to verify a situation of threshold voltage distributions of the plurality of the second memory cells. The first sensing operation may also be referred to as a state verification operation of a plurality of second memory cells of the (i−1)-th potential state (e.g., the potential state S1). The "first memory cells" in this embodiment refers to the memory cells to be programmed to the i-th potential state (e.g., the potential state S2), and the "second memory cell" in this embodiment refers to the memory cells to be programmed to the (i−1)-th potential states (e.g., the potential state S1). Thus, the first memory cell and the second memory cell are not the same.

The detailed steps of step S320 may be, in the first time period STP11, the threshold voltage of each second memory cell is sensed by comparing the current obtained at a sensing end of each second memory cell in the (i−1)-th potential state (e.g., the potential state S1) with the reference level. The reference level is related to the reference voltage Vs1, and the reference level corresponds to a predetermined sensing time (e.g., the first time period STP11).

When the current obtained at the sensing end of the second memory cell in the first time period STP11 is smaller than the predetermined current corresponding to the reference level (the logic value in this embodiment is "0"), it means that the second memory cell will be counted in the first part number SU_i−1 (or, the upper part number) corresponding to the threshold voltage distribution of the second memory cells. That is to say, the first part number SU_i−1 is to count the number of memory cells in the first part of the (i−1)-th potential state (e.g., the potential state S1) as the first verification result, and the first verification result corresponds to an upper part (e.g., the upper part number SU_1 of FIG. 2) in the threshold voltage distribution (e.g., the threshold voltage distribution PD2 of FIG. 2) of the second memory cells.

When the current obtained at the sensing end of the second memory cell in the first time period STP11 is greater than the predetermined current corresponding to the reference level (the logic value in this embodiment is "1"), it means that the second memory cell will be counted in the second part number SD_i−1 (or, the lower part number) corresponding to the threshold voltage distribution of the second memory cells. That is to say, the second part number SD_i−1 is to count the number of memory cells in the second part of the (i−1)-th potential state (e.g., the potential state S1) as the second verification result, and the second verification result corresponds to a lower part (e.g., the lower part number SD_1 of FIG. 2) in the threshold voltage distribution (e.g., the threshold voltage distribution PD2 of FIG. 2) of the second memory cells.

In the aforementioned step S320, the upper part value (e.g., the first part number SU_1) and the lower part value (e.g., the second part number SD_1) of the threshold voltage distribution values of the second memory cells in the (i−1)-th potential state can be obtained after the programming operations, to verify the situation of threshold voltage distributions of the plurality of the second memory cells.

In step S330, the memory controller 110 performs a second sensing operation on the plurality of first memory cells of the i-th potential state (eg, potential state S2) in the verification phase VP to implement the i-th potential state. Programming verification operations for states (e.g., potential state S2). The second sensing operation may also be referred to as a programming verification operation of a plurality of first memory cells of the i-th potential state (eg, potential state S2).

The detailed steps of the step S330 may be, in the second time period STP12, the threshold voltage of each first memory cell is sensed by comparing the current obtained at a sensing end of each first memory cell in the i-th potential state (e.g., the potential state S2) with the reference level. The reference level is related to the reference voltage V2, and the reference level corresponds to a predetermined sensing time (e.g., the second time period STP12). In this embodiment, the time lengths of the first time period STP11 and the second time period STP12 may be different.

When the current obtained by the sensing end of the first memory cell in the second time period STP12 is smaller than the predetermined current corresponding to the reference level (the logic value in this embodiment is "0"), it means that the first memory cell is successful for verification and will be counted in the verification success value CSX_pass corresponding to the threshold voltage distribution PSi−1 of the first memory cells. Correspondingly, when the current obtained by the sensing end of the first memory cell in the second time period STP12 is greater than the predetermined current corresponding to the reference level (the logic value in this embodiment is "1"), it means that the first memory cell is failed for verification and will be counted in the verification failure value CSX_fail corresponding to the threshold voltage distribution PSi−1 of the first memory cells.

In step S340, the memory controller 110 determines whether the first memory cells pass the programming verification operation of the i-th potential state (e.g., the potential state S2). The condition for passing the programming verification operation is whether the threshold voltage of each first memory cell is greater than or equal to the reference voltage V2 (as shown in the threshold voltage distribution Psi-T in FIG. 4), that is, the verification failure value CSX_fail is zero. When the step S340 is NO, the step S340 is entered into the step S350, the memory controller 110 increases the voltage of the program pulse in steps, and it applies the program pulse to the first memory cells in the potential state S2 in steps multiple times in the step S310. On the other hand, when step S340 is YES and the step S320 has been performed, it enters the step S360, the memory controller 110 completes the programming operation of the i-th potential state. And, if 'i' is not N, then 'i' is incremented by 1, and this embodiment will continue with the programming operation of the next potential state. The programming operation consisting of steps S310, S320 to S350 in this embodiment can be called an increment-step-pulse-programming (ISPP) operation.

In this embodiment, the ISPP operation may be performed multiple times, and the state verification operation for the (i−1)-th potential state (e.g., the potential state S1) in step S320 can be performed once. The step S320 does not necessarily required for performed multiple times. For example, the performing time point of the step S320 may be set in one of the last times to last third times of the programming verification operations in the ISPP operation.

In the first embodiment of FIG. 4, the first time period STP11 of the first sensing operation (the state verification operation) is different from the second time period STP12 of the second sensing operation (programming verification operation). The first time period STP11 and the second time period STP12 are both in the verification phase VP. The first time period STP11 is different from the second time period STP12 and does not overlap with each other.

In the verification phase VP, a program pulse corresponding to the i-th potential state (e.g., the potential state S2) is applied to the word line of the first memory cell, as shown in waveform SelWL in FIG. 4. The voltage on the word line of the unselected memory cell appears as the waveform UnSelWL in FIG. 4. The second memory cell is inhibited during the second time period STP12 of the second sensing operation. Conversely, the first memory cell is inhibited during the first time period STP11 of the first sensing operation. The second memory cell is also inhibited during the program pulse phase PPP.

FIG. 5 is a schematic diagram of the states of each memory cell in the programming verification operation for the potential state S2 in an embodiment of the present invention. Referring to FIG. 5, the first sensing operation is to perform a state verification operation on the memory cells (second memory cells) in the potential state S1. When the current obtained by the sensing end of the second memory cell in the first time period STP11 is smaller than the predetermined current corresponding to the reference level (the logic value in this embodiment is “0”), it means that the second memory cell will be counted in the first part number SU_1 corresponding to the threshold voltage distribution of the second memory cells. On the other hand, when the current obtained by the sensing end of the second memory cell in the first time period STP11 is greater than the predetermined current corresponding to the reference level (the logic value in this embodiment is “1”), it means that the second memory cell will be counted in the second part number SD_1 corresponding to the threshold voltage distribution of the second memory cells.

The second sensing operation is to perform a programming verification operation on the memory cells (first memory cells) of the potential state S2. When the current obtained by the sensing end of the first memory cell in the second time period STP12 is smaller than the predetermined current corresponding to the reference level (the logic value in this embodiment is “0”), it means that the first memory cell of the potential state S2 is successful for verification. Correspondingly, when the current obtained by the sensing end of the first memory cell in the second time period STP12 is greater than the predetermined current corresponding to the reference level (the logic value in this embodiment is “1”), it means that the first memory cell of the potential state S2 is failed for verification, and it needs to increase the voltage of the program pulse in steps to continue the programming verification operation of the first memory cell of the potential state S2.

Figure 6:
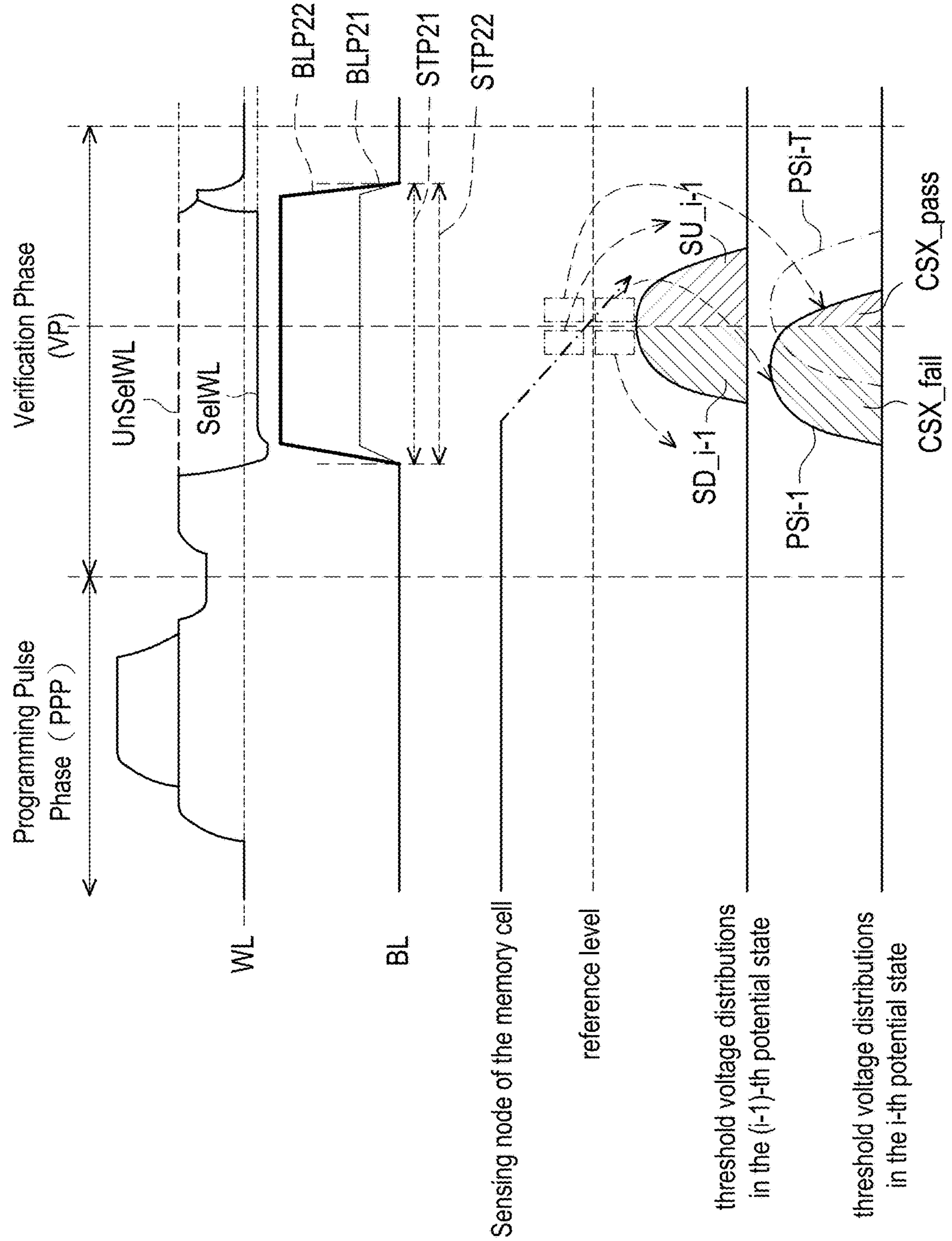
FIG. 6 is a schematic diagram of each signal in step S300 according to a second embodiment of the present invention.

FIG. 6 is a schematic diagram of each signal in the step S300 according to the second embodiment of the present invention. The main difference between the second embodiment of FIG. 6 and the first embodiment of FIG. 4 is that, the first time period STP11 for performing the first sensing operation (the state verification operation) is the same as the second time period STP12 for performing the second sensing operation (the programming verification operation). The first time period STP11 and the second time period STP12 are both in the verification phase VP. During the first time period STP11 for performing the first sensing operation, the memory controller 110 of FIG. 1 applies the first bit line voltage BLP21 to the bit lines BL of the plurality of second memory cells. On the other hand, during the second time period STP12 of performing the second sensing operation, the memory controller 110 of FIG. 1 applies the second bit line voltage BLP22 to the bit lines BL of the plurality of first memory cells. The voltage value of the first bit line voltage BLP21 is smaller than the voltage value of the second bit line voltage BLP22. In addition to complying with the steps in the control method of FIG. 3, the second embodiment of FIG. 6 is also consistent with the states of each memory cell in the programming verification operation for the potential state S2 shown in FIG. 5.

To sum up, the operation method for a memory device and the memory device therefore described in the embodiment of the disclosure involves inserting a sensing operation for memory cells in the previous potential state during a programming operation based on each potential state, in order to verify the threshold voltage distributions in the previous potential state. Moreover, the programming operations for each potential state will not significantly extend the operation time due to the inserted sensing operation. The aforementioned threshold voltage distributions may refer to an upper part and a lower part of the threshold voltage distribution for memory cells in the previous potential state. Therefore, this embodiment of the invention incorporates the step of verifying the threshold voltage distribution into the programming operation, thereby reducing the time overhead for reading operations on memory cells.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An operation method for a memory device, wherein the memory device comprises a memory block with a plurality of memory cells, each of the plurality of the memory cells comprising N potential states associated with a plurality of threshold voltage distributions, N is a positive integer, wherein the operation method comprising:

performing a programming operation to the plurality of the memory cells based on an i-th potential state among the N potential states, i is a positive integer greater than 1 and i is less than or equal to N, wherein the programming operation based on the i-th potential state comprises:

in a program pulse phase, applying a program pulse corresponding to the i-th potential state to a plurality of first memory cells corresponding to the i-th potential state; and in a verification phase after the program pulse phase, performing a first sensing operation to a plurality of second memory cells in the (i−1)-th potential state to verify a situation of threshold voltage distributions of the plurality of the second memory cells, and performing a second sensing operation to the plurality of the first memory cells to implement a program verification operation of the i-th potential state, wherein performing the first sensing operation comprising:

sensing threshold voltages of the plurality of the second memory cells; and obtaining a first partial quantity and a second partial quantity based on a predetermined sensing time according to a reference level, wherein the first partial quantity is to count a first partial cell number of the plurality of the second memory cells for a first verified result corresponded to a lower part of a threshold distribution of the plurality of the second memory cells, the second partial quantity is to count a second partial cell number of the plurality of the second memory cells for a second verified result corresponded to a higher part of the threshold distribution of the plurality of the second memory cells.

2. The operation method according to claim 1, wherein in the programming operation based on the i-th potential state, the first sensing operation is performed once on the plurality of the second memory cells.

3. The operation method according to claim 1, wherein a first time period for performing the first sensing operation is different from a second time period for performing the second sensing operation, the first time period and the second time period occur during the verification phase, and the first time period and the second time period are distinct and non-overlapping.

4. The operation method according to claim 1, wherein performing the first sensing operation comprising:

during a first time period for performing the first sensing operation, a first word line voltage is applied to the plurality of the second memory cells; and during a second time period for performing the second sensing operation, a second word line voltage is applied to the plurality of the first memory cells, where a voltage value of the first bit line voltage is different from a voltage value of the second bit line voltage.

5. The operation method according to claim 4, wherein the first time period and the second time period are the same, and the first time period and the second time period occur during the verification phase.

6. The operation method according to claim 1, wherein the program pulse corresponding to the i-th potential state to applied to word lines of the plurality of the first memory cells, and the plurality of the second memory cells is inhibited.

7. The operation method according to claim 1, wherein the programming operation is an incremental step pulse programming (ISPP) operation.

8. The operation method according to claim 7, further comprising:

while the program verification operation for the i-th potential state is not passed, incrementally increasing a voltage of the program pulse, and the increased program pulse is applied to the plurality of the first memory cells corresponding to the i-th potential state.

9. A memory device, comprising:

a memory array, comprises a memory block, wherein the memory block comprises a plurality of memory cells, each of the plurality of the memory cells comprising N potential states associated with a plurality of threshold voltage distributions, N is a positive integer; and a memory controller, coupled to the memory block, wherein the memory controller is configured to:

performing a programming operation to the plurality of memory cells based on an i-th potential state among the N potential states, i is a positive integer greater than 1 and i is less than or equal to N, wherein the programming operation based on the i-th potential state comprises:

in a program pulse phase, applying a program pulse corresponding to the i-th potential state to a plurality of first memory cells corresponding to the i-th potential state; and in a verification phase after the program pulse phase, performing a first sensing operation to a plurality of second memory cells in the (i−1)-th potential state to verify a situation of threshold voltage distributions of the plurality of second memory cells, and performing a second sensing operation to the plurality of the first memory cells to implement a program verification operation of the i-th potential state, wherein performing the first sensing operation comprising:

sensing threshold voltages of the plurality of the second memory cells; and obtaining a first partial quantity and a second partial quantity based on a predetermined sensing time according to a reference level, wherein the first partial quantity is to count a first partial cell number of the plurality of the second memory cells for a first verified result corresponded to a lower part of a threshold distribution of the plurality of the second memory cells, the second partial quantity is to count a second partial cell number of the plurality of the second memory cells for a second verified result corresponded to a higher part of the threshold distribution of the plurality of the second memory cells.

10. The memory device according to claim 9, wherein in the programming operation based on the i-th potential state, the first sensing operation is performed once on the plurality of the second memory cells.

11. The memory device according to claim 9, wherein a first time period for performing the first sensing operation is different from a second time period for performing the second sensing operation, the first time period and the second time period occur during the verification phase, and the first time period and the second time period are distinct and non-overlapping.

12. The memory device according to claim 9, wherein performing the first sensing operation comprising:

during a first time period for performing the first sensing operation, a first word line voltage is applied to the plurality of the second memory cells; and during a second time period for performing the second sensing operation, a second word line voltage is applied to the plurality of the first memory cells.

13. The memory device according to claim 12, wherein the first time period and the second time period are the same, and the first time period and the second time period occur during the verification phase.

14. The memory device according to claim 9, wherein the program pulse corresponding to the i-th potential state to applied to word lines of the plurality of the first memory cells, and the plurality of the second memory cells is inhibited.

15. The memory device according to claim 9, wherein the programming operation is an incremental step pulse programming (ISPP) operation.

16. The memory device according to claim 9, wherein the memory controller is further configured to:

while the program verification operation for the i-th potential state is not passed, incrementally increasing a voltage of the program pulse, and the increased program pulse is applied to the plurality of the first memory cells corresponding to the i-th potential state.

* * * * *